(12) United States Patent
Kim et al.

(10) Patent No.: US 12,172,313 B2
(45) Date of Patent: Dec. 24, 2024

(54) SUBSTRATE PROCESSING APPARATUS AND SUBSTRATE ALIGNMENT METHOD USING THE SAME

(71) Applicant: SAMSUNG ELECTRONICS CO., LTD., Suwon-si (KR)

(72) Inventors: Daejung Kim, Seoul (KR); Minyoung Kang, Seoul (KR); Sungsoo Kim, Yongin-si (KR); Sohee Kim, Sejong-si (KR); Yongsoo Yoo, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 187 days.

(21) Appl. No.: 17/957,967

(22) Filed: Sep. 30, 2022

(65) Prior Publication Data
US 2023/0264350 A1    Aug. 24, 2023

(30) Foreign Application Priority Data

Feb. 24, 2022   (KR) .......................... 10-2022-0024592

(51) Int. Cl.
*B25J 9/16*    (2006.01)
*B25J 11/00*   (2006.01)
*B25J 19/02*   (2006.01)

(52) U.S. Cl.
CPC .............. *B25J 9/163* (2013.01); *B25J 9/1684* (2013.01); *B25J 9/1697* (2013.01); *B25J 11/0095* (2013.01); *B25J 19/021* (2013.01)

(58) Field of Classification Search
CPC ........ B25J 9/163; B25J 9/1684; B25J 9/1697; B25J 11/0095; B25J 19/021
See application file for complete search history.

(56) References Cited

U.S. PATENT DOCUMENTS

| 4,326,332 A | 4/1982 | Kenney |
| 4,362,486 A | 12/1982 | Davis et al. |
| 4,364,074 A | 12/1982 | Garnache et al. |

(Continued)

FOREIGN PATENT DOCUMENTS

| CN | 111640694 B | 9/2021 |
| KR | 10-0246850 B1 | 3/2000 |

(Continued)

OTHER PUBLICATIONS

US 9,871,003 B2, 01/2018, Fujiwara (withdrawn)

*Primary Examiner* — Kira Nguyen
(74) *Attorney, Agent, or Firm* — Sughrue Mion, PLLC

(57) ABSTRACT

A method includes performing a substrate processing process by carrying a substrate into a chamber, and disposing the substrate in a loading region of the chamber, capturing an image of a lower surface of the substrate to acquire a first image, identifying particle patterns formed on the lower surface of the substrate in the substrate processing process, and an edge of the substrate, from the first image, calculating a first alignment error value of a deviation between an approximate position value for the center of the loading region calculated from the particle patterns and an approximate position value for a center of the substrate calculated from the edge of the substrate, and determining a point in time for teaching a transfer robot that deposits the substrate into the chamber, based on the first alignment error value.

20 Claims, 14 Drawing Sheets

(56) References Cited

U.S. PATENT DOCUMENTS

| | | |
|---|---|---|
| 4,399,205 A | 8/1983 | Bergendahl |
| 4,513,203 A | 4/1985 | Bohlen et al. |
| 4,668,045 A | 5/1987 | Melman et al. |
| 4,743,953 A | 5/1988 | Toyokura et al. |
| 4,835,078 A | 5/1989 | Harvey et al. |
| 4,904,087 A | 2/1990 | Harvey et al. |
| 5,042,709 A | 8/1991 | Cina et al. |
| 5,093,740 A | 3/1992 | Dorschner et al. |
| 5,138,429 A | 8/1992 | Nagesh et al. |
| 5,229,331 A | 7/1993 | Doan et al. |
| 5,257,336 A | 10/1993 | Dautartas |
| 5,274,575 A | 12/1993 | Abe |
| 5,275,897 A | 1/1994 | Nagesh et al. |
| 5,333,166 A | 7/1994 | Seligson et al. |
| 5,372,973 A | 12/1994 | Doan et al. |
| 5,413,489 A | 5/1995 | Switky |
| 5,436,571 A | 7/1995 | Karasawa |
| 5,469,263 A | 11/1995 | Waldo, III et al. |
| 5,552,916 A | 9/1996 | O'Callaghan et al. |
| 5,573,963 A | 11/1996 | Sung |
| 5,610,930 A | 3/1997 | Macomber et al. |
| 5,631,987 A | 3/1997 | Lasky et al. |
| 5,679,125 A | 10/1997 | Hiraiwa et al. |
| 5,723,374 A | 3/1998 | Huang et al. |
| 5,759,867 A | 6/1998 | Armacost et al. |
| 5,792,680 A | 8/1998 | Sung et al. |
| 5,808,805 A | 9/1998 | Takahashi |
| 5,835,285 A | 11/1998 | Matsuzawa et al. |
| 5,842,300 A | 12/1998 | Cheshelski et al. |
| 5,859,947 A | 1/1999 | Kiryuscheva et al. |
| 5,872,042 A | 2/1999 | Hsu et al. |
| 5,861,997 A | 6/1999 | Takahashi |
| 5,911,108 A | 6/1999 | Yen |
| 5,940,564 A | 8/1999 | Jewell et al. |
| 5,972,753 A | 10/1999 | Lin et al. |
| 5,995,688 A | 11/1999 | Aksyuk et al. |
| 5,998,252 A | 12/1999 | Huang |
| 5,999,333 A | 12/1999 | Takahashi |
| 6,013,954 A | 1/2000 | Hamajima |
| 6,045,426 A | 4/2000 | Wang et al. |
| 6,084,723 A | 7/2000 | Matsuzawa et al. |
| 6,087,283 A | 7/2000 | Jinbo et al. |
| 6,140,220 A | 10/2000 | Lin |
| 6,180,977 B1 | 1/2001 | Lin et al. |
| 6,184,104 B1 | 2/2001 | Tan et al. |
| 6,189,339 B1 | 2/2001 | Hiraiwa |
| 6,204,134 B1 | 3/2001 | Shih |
| 6,206,272 B1 | 3/2001 | Waldron-Floyde et al. |
| 6,207,532 B1 | 3/2001 | Lin et al. |
| 6,242,318 B1 | 6/2001 | Mugibayashi et al. |
| 6,243,508 B1 | 6/2001 | Jewell et al. |
| 6,266,472 B1 | 7/2001 | Norwood et al. |
| 6,348,733 B1 | 2/2002 | Lin |
| 6,350,680 B1 | 2/2002 | Shih et al. |
| 6,352,904 B2 | 3/2002 | Tan et al. |
| 6,365,059 B1 | 4/2002 | Pechenik |
| 6,400,038 B2 | 6/2002 | Mugibayashi et al. |
| 6,406,994 B1 | 6/2002 | Ang et al. |
| 6,421,474 B2 | 7/2002 | Jewell et al. |
| RE37,846 E | 9/2002 | Matsuzawa et al. |
| 6,492,269 B1 | 12/2002 | Liu et al. |
| 6,503,770 B1 | 1/2003 | Ho et al. |
| 6,509,264 B1 | 1/2003 | Li et al. |
| 6,518,210 B1 | 2/2003 | Jinbo et al. |
| 6,521,530 B2 | 2/2003 | Peters et al. |
| 6,541,346 B2 | 4/2003 | Malik |
| 6,542,672 B2 | 4/2003 | Jewell et al. |
| 6,579,407 B1 | 6/2003 | Boyd et al. |
| 6,623,911 B1 | 9/2003 | Jong et al. |
| 6,648,204 B2 | 11/2003 | Waldron-Floyde et al. |
| RE38,421 E | 2/2004 | Takahashi |
| RE38,438 E | 2/2004 | Takahashi |
| 6,690,185 B1 | 2/2004 | Khandros et al. |
| 6,735,492 B2 | 5/2004 | Conrad et al. |
| 6,741,777 B2 | 5/2004 | Jewell et al. |
| 6,742,980 B2 | 6/2004 | Sasaki |
| 6,819,426 B2 | 11/2004 | Sezginer et al. |
| 6,894,362 B2 | 5/2005 | Malik |
| 6,907,178 B2 | 6/2005 | Lerner et al. |
| 6,931,181 B2 | 8/2005 | Jewell et al. |
| 6,933,523 B2 | 8/2005 | Sheck |
| 6,955,984 B2 | 10/2005 | Wan et al. |
| 6,959,024 B2 | 10/2005 | Paldus et al. |
| RE39,024 E | 3/2006 | Takahashi |
| 7,025,854 B2 | 4/2006 | Boyd et al. |
| 7,034,854 B2 | 4/2006 | Cruchon-Dupeyrat et al. |
| 7,042,569 B2 | 5/2006 | Sezginer et al. |
| 7,298,496 B2 | 11/2007 | Hill |
| 7,324,216 B2 | 1/2008 | Hill |
| 7,359,043 B2 | 4/2008 | Tsuchiya et al. |
| 7,375,809 B2 | 5/2008 | Seipp |
| 7,431,705 B2 | 10/2008 | Wilkins |
| 7,486,878 B2 | 2/2009 | Chen et al. |
| 7,508,034 B2 | 3/2009 | Takafuji et al. |
| 7,522,267 B2 | 4/2009 | Hofsmeister et al. |
| 7,545,497 B2 | 6/2009 | Seipp |
| 7,623,698 B2 | 11/2009 | Soenksen et al. |
| 7,644,489 B2 | 1/2010 | Arora et al. |
| 7,650,029 B2 | 1/2010 | Picciotto et al. |
| 7,762,638 B2 | 7/2010 | Cruchon-Dupeyrat et al. |
| 7,942,622 B2 | 5/2011 | Kondoh et al. |
| 8,053,894 B2 | 11/2011 | Wan et al. |
| 8,106,349 B2 | 1/2012 | Ding et al. |
| 8,207,058 B1 | 6/2012 | Fedorov et al. |
| 8,260,461 B2 | 9/2012 | Krishnasamy et al. |
| 8,289,388 B2 | 10/2012 | Cheng et al. |
| 8,378,414 B2 | 2/2013 | Miller et al. |
| 8,421,161 B2 | 4/2013 | Iwamoto |
| 8,459,922 B2 | 6/2013 | Hosek |
| 8,515,294 B2 | 8/2013 | Britz et al. |
| 8,531,029 B2 | 9/2013 | Fedorov et al. |
| 8,546,717 B2 | 10/2013 | Stecker |
| 8,632,295 B2 | 1/2014 | Onishi et al. |
| 8,740,535 B2 | 6/2014 | Kondoh et al. |
| 8,755,316 B2 | 6/2014 | Aschan et al. |
| 8,767,199 B2 | 7/2014 | Dozor et al. |
| 8,892,248 B2 | 11/2014 | Hosek |
| 8,967,935 B2 | 3/2015 | Goodman et al. |
| 9,024,456 B2 | 5/2015 | Yang et al. |
| 9,035,267 B2 | 5/2015 | Maxwell et al. |
| 9,106,344 B2 | 8/2015 | Britz et al. |
| 9,228,270 B2 | 1/2016 | Feng et al. |
| 9,338,788 B2 | 5/2016 | Britz et al. |
| 9,399,264 B2 | 7/2016 | Stecker |
| 9,422,651 B2 | 8/2016 | Roberts et al. |
| 9,424,646 B2 | 8/2016 | Ikeda et al. |
| 9,543,178 B2 | 1/2017 | Lee et al. |
| 9,543,223 B2 | 1/2017 | Habets |
| 9,547,143 B2 | 1/2017 | Frederick et al. |
| 9,568,826 B2 | 2/2017 | Fujiwara |
| 9,574,290 B2 | 2/2017 | Roberts et al. |
| 9,728,168 B2 | 8/2017 | Mitani et al. |
| 9,911,701 B2 | 3/2018 | Fujiwara |
| 9,915,520 B2 | 3/2018 | Cable et al. |
| 9,941,217 B2 | 4/2018 | Shiba et al. |
| 9,988,734 B2 | 6/2018 | Feng et al. |
| 10,065,340 B2 | 9/2018 | Moyal |
| 10,066,311 B2 | 9/2018 | Ostrowski et al. |
| 10,124,367 B2 | 11/2018 | Roberts et al. |
| 10,145,026 B2 | 12/2018 | D'Evelyn et al. |
| 10,189,114 B2 | 1/2019 | Stecker |
| 10,234,267 B2 | 3/2019 | Cable et al. |
| 10,236,259 B2 | 3/2019 | Shiba et al. |
| 10,295,914 B2 | 5/2019 | Habets |
| 10,338,472 B2 | 7/2019 | Fujiwara |
| 10,435,807 B2 | 10/2019 | Feng et al. |
| 10,461,039 B2 | 10/2019 | Shiba et al. |
| 10,585,362 B2 | 3/2020 | Kuwahara |
| 10,604,865 B2 | 3/2020 | D'Evelyn et al. |
| 10,661,304 B2 | 5/2020 | Roberts et al. |
| 10,739,688 B2 | 8/2020 | Habets |
| 10,847,393 B2 | 11/2020 | Potter et al. |
| 10,902,350 B2 | 1/2021 | Banerjee et al. |
| 10,908,045 B2 | 2/2021 | Coulter et al. |

(56) References Cited

U.S. PATENT DOCUMENTS

| | | |
|---|---|---|
| 10,926,756 B2 | 2/2021 | Dastous et al. |
| 10,935,957 B2 | 3/2021 | Kashiwagi et al. |
| 10,978,330 B2 | 4/2021 | Yin et al. |
| 11,094,569 B2 | 8/2021 | Sato |
| 11,165,514 B2 | 11/2021 | Balteanu et al. |
| 2001/0035400 A1 | 11/2001 | Gartner et al. |
| 2003/0119649 A1 | 6/2003 | Jinbo et al. |
| 2003/0124844 A1 | 7/2003 | Li et al. |
| 2003/0235226 A1 | 12/2003 | Ueki |
| 2005/0074047 A1 | 4/2005 | Boggy et al. |
| 2005/0243884 A1 | 11/2005 | Paldus et al. |
| 2006/0174753 A1 | 3/2006 | Aisenbrey |
| 2007/0108638 A1 | 5/2007 | Lane et al. |
| 2007/0228425 A1 | 10/2007 | Miller et al. |
| 2008/0203536 A1 | 8/2008 | Furukawa et al. |
| 2009/0078562 A1 | 3/2009 | Johnson et al. |
| 2009/0095956 A1 | 4/2009 | Takafuji et al. |
| 2010/0242765 A1 | 9/2010 | Cruchon-Dupeyrat et al. |
| 2011/0019876 A1* | 1/2011 | Galoppo .................. G06T 7/30 382/294 |
| 2011/0075123 A1 | 3/2011 | Nagamori |
| 2011/0190927 A1 | 8/2011 | Douki |
| 2011/0245964 A1 | 10/2011 | Sullivan et al. |
| 2011/0249025 A1 | 10/2011 | Mitani et al. |
| 2011/0297141 A1 | 12/2011 | Correia et al. |
| 2011/0311722 A1 | 12/2011 | Faris |
| 2012/0012972 A1 | 1/2012 | Takafuji et al. |
| 2012/0034591 A1 | 2/2012 | Morse, III et al. |
| 2013/0119106 A1 | 5/2013 | Moyal |
| 2013/0176519 A1 | 7/2013 | Hayama et al. |
| 2013/0179236 A1 | 7/2013 | Hicyilmaz et al. |
| 2013/0181339 A1 | 7/2013 | Fan et al. |
| 2015/0212377 A1 | 7/2015 | Imaoku et al. |
| 2015/0219560 A1 | 8/2015 | Maxwell et al. |
| 2016/0148366 A1* | 5/2016 | Amano ................ G06T 7/0008 348/87 |
| 2016/0370797 A1 | 12/2016 | Azarya et al. |
| 2018/0345316 A1 | 12/2018 | Roberts et al. |
| 2018/0347065 A1 | 12/2018 | Feng et al. |
| 2018/0363162 A1 | 12/2018 | Ostrowski et al. |
| 2019/0046373 A1 | 2/2019 | Coulter et al. |
| 2019/0143445 A1 | 5/2019 | Stecker |
| 2019/0172742 A1* | 6/2019 | Mochizuki ............ H01L 21/681 |
| 2019/0184480 A1 | 6/2019 | Auyeung et al. |
| 2020/0246939 A1 | 8/2020 | Kashiwagi et al. |
| 2020/0254625 A1 | 8/2020 | Rogers |
| 2020/0292766 A1 | 9/2020 | Vermeulen et al. |
| 2020/0350258 A1 | 11/2020 | Lee et al. |
| 2021/0008591 A1 | 1/2021 | Lindefjeld et al. |
| 2021/0028800 A1 | 1/2021 | Balteanu et al. |
| 2021/0131874 A1 | 5/2021 | Xu |
| 2021/0145665 A1 | 5/2021 | Coulter et al. |
| 2021/0170584 A1* | 6/2021 | Kopec ................. H01L 21/6735 |
| 2021/0186454 A1 | 6/2021 | Behzadi et al. |
| 2021/0275129 A1 | 9/2021 | Behzadi et al. |
| 2021/0276540 A1 | 9/2021 | Dastous et al. |
| 2021/0384058 A1 | 12/2021 | Harada et al. |
| 2022/0020575 A1 | 1/2022 | Kwon et al. |
| 2022/0148857 A1* | 5/2022 | Amikura ............ H01J 37/32642 |

FOREIGN PATENT DOCUMENTS

| | | |
|---|---|---|
| KR | 10-1977755 B1 | 5/2019 |
| KR | 10-2125839 B1 | 6/2020 |
| KR | 10-2021-0027647 A | 3/2021 |
| KR | 10-2021-0150283 A | 12/2021 |
| KR | 10-2021-0155192 A | 12/2021 |
| KR | 10-2022-0021897 A | 2/2022 |
| KR | 10-2721980 B1 | 10/2024 |

* cited by examiner

RF_IMG1

IMG1

SUBSTRATE PROCESSING APPARATUS AND SUBSTRATE ALIGNMENT METHOD USING THE SAME

CROSS-REFERENCE TO RELATED APPLICATION

This application claims priority from Korean Patent Application No. 10-2022-0024592 filed on Feb. 24, 2022 in the Korean Intellectual Property Office, the disclosure of which is incorporated by reference herein in its entirety.

BACKGROUND

The present disclosure relates to a substrate processing apparatus and a substrate alignment method using the same.

Semiconductor devices may be widely used in the electronics industry due to characteristics thereof such as miniaturization, multifunctionality, low manufacturing costs, and/or the like. The semiconductor devices may be manufactured by various manufacturing processes such as a photolithography process, an etching process, a deposition process, an ion implantation process, and a cleaning process.

In general, each of these manufacturing processes may be performed sequentially in different processing modules. A substrate may be transferred between different processing modules. However, when the substrate is not disposed in a proper position in a chamber, a process of correcting the position may be required, but for this, there is a problem that usage of the equipment should be stopped.

SUMMARY

It is an aspect to provide a substrate processing apparatus and a substrate alignment method, seating a substrate in a target position in a processing module without stopping usage of equipment.

According to an aspect of one or more embodiments, there is provided a method comprising performing a substrate processing process by carrying a substrate into a chamber and disposing the substrate in a loading region of the chamber; determining whether to carry a sensor module into the chamber based on a first alignment error value, the first alignment error value being calculated by capturing an image of a lower surface of the substrate to acquire a first image, identifying an edge of the substrate and particle patterns attached to and formed on the lower surface of the substrate during the substrate processing process, from the first image, and calculating the first alignment error value of a deviation between an approximate position value for a center of the loading region calculated from the particle patterns and a center of the substrate calculated from the edge of the substrate; and determining whether to teach a transfer robot that deposits the substrate in the chamber based on a second alignment error value, the second alignment error value being calculated by disposing the sensor module in the loading region, capturing an image of the loading region to acquire a second image, extracting an edge of the loading region from the second image, calculating a precise position value for the center of the loading region from the edge of the loading region, and calculating the second alignment error value of a deviation between the precise position value and a pre-stored reference position value.

According to another aspect of one or more embodiments, there is provided a method comprising performing a substrate processing process by carrying a substrate into a chamber and disposing the substrate in a loading region of the chamber; capturing an image of a lower surface of the substrate to acquire a first image; identifying particle patterns formed on the lower surface of the substrate during the substrate processing process, and an edge of the substrate, from the first image; calculating a first alignment error value of a deviation between a first approximate position value for a center of the loading region calculated from the particle patterns and a second approximate position value for a center of the substrate calculated from the edge of the substrate; and determining a point in time for teaching a transfer robot that disposes the substrate into the chamber, based on the first alignment error value.

According to yet another aspect of one or more embodiments, there is provided a method comprising performing a substrate processing process by disposing a substrate in a loading region in a chamber; acquiring a first image by capturing an image of a lower surface of the substrate; identifying particle patterns formed on the lower surface, and an edge of the substrate, from the first image; calculating an approximate position value for a center of the loading region from the particle patterns and calculating a center of the substrate from the edge of the substrate; calculating a first alignment error value of a deviation between the approximate position value for the center of the loading region and the center of the substrate; determining whether to carry a sensor module into the chamber, based on the first alignment error value; when it is determined to carry the sensor module into the chamber, carrying the sensor module into the chamber, disposing the sensor module in the loading region, and capturing a second image of the loading region; extracting an edge of the loading region from the second image; calculating a precise position value for the center of the loading region from the edge of the loading region; calculating a second alignment error value of a deviation between the precise position value and a pre-stored reference position value; and determining a point in time for teaching a transfer robot that deposits the substrate in the chamber, based on the second alignment error value.

According to yet another aspect of one or more embodiments, there is provided a substrate processing apparatus comprising a chamber having an internal space in which a substrate processing process for processing a substrate is performed; an electrostatic chuck that is disposed in the internal space and that has a loading region in which a lower surface of the substrate is seated and an instrument is disposed; an image capturing device that acquires a first image by capturing an image of the lower surface of the substrate on which the substrate processing process is performed; a sensor module that is carried into the internal space, is seated in the loading region, and acquires a second image by capturing an image of the loading region; a transfer robot that carries the sensor module and the substrate into and out of the internal space; and a controller. The controller is configured to identify particle patterns formed on the lower surface of the substrate by the instrument during the substrate processing process and an edge of the substrate, from the first image, calculate a first alignment error value of a deviation between an approximate position value for a center of the loading region from the particle patterns and calculate a center of the substrate from the edge of the substrate, determine a point in time for carrying the sensor module into the internal space, based on the first alignment error value, detect an edge of the loading region from the second image, calculate a second alignment error value by comparing the edge of the loading region with a reference position value, and correct the second alignment error value by teaching the transfer robot.

BRIEF DESCRIPTION OF DRAWINGS

The above and other aspects will be more clearly understood from the following detailed description, taken in conjunction with the accompanying drawings, in which.

DETAILED DESCRIPTION

As discussed above, manufacturing processes used in manufacturing a semiconductor substrate may be performed sequentially in different processing modules. A substrate may be transferred between different processing modules by a transfer unit such as a transfer robot. When the substrate is not disposed in a proper position of a chamber by the transfer unit, a process of correcting the reference position of the transfer unit may be required, but for this, there is a problem that usage of equipment should be stopped.

Hereinafter, various embodiments will be described in detail with reference to the accompanying drawings.

Figure 1:
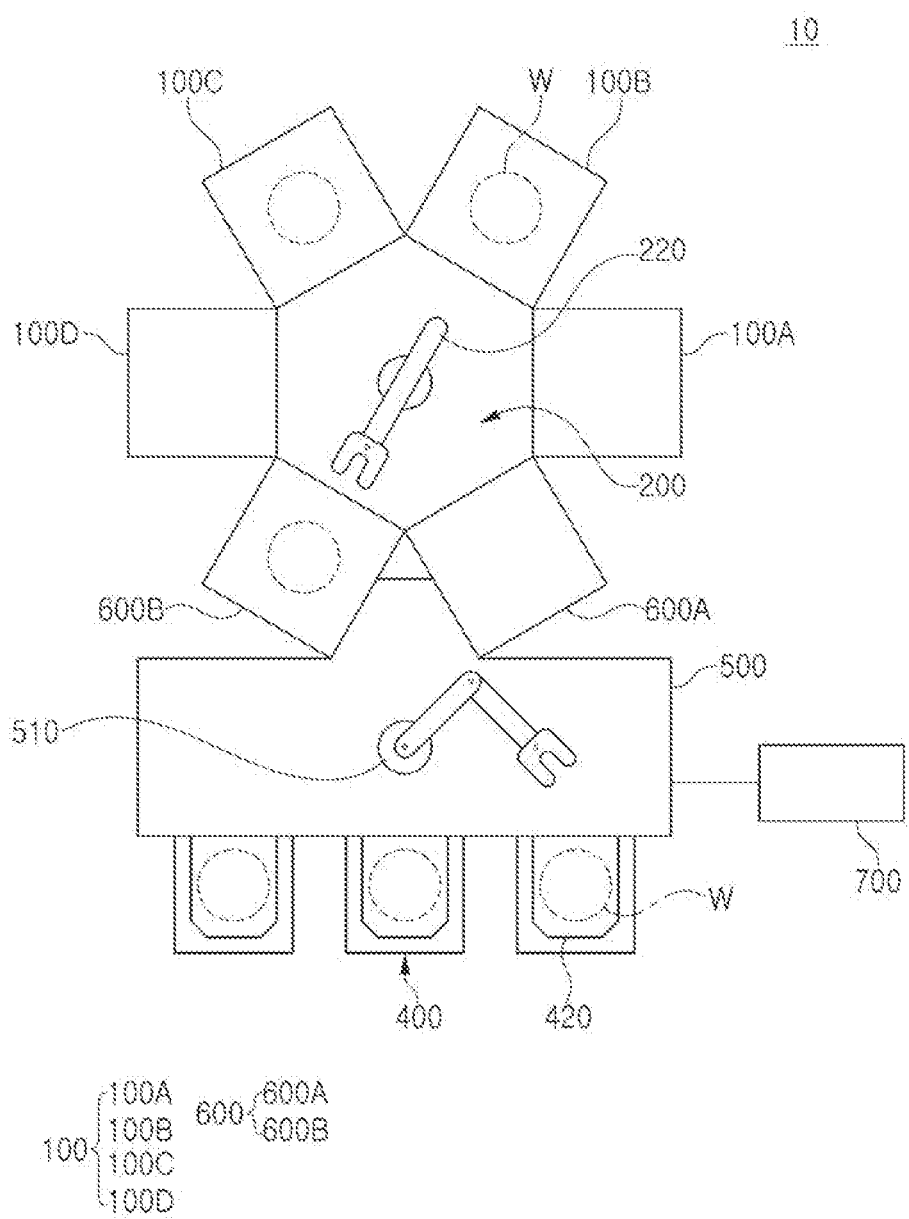
FIG. 1 is a schematic plan view of a substrate processing apparatus according to an embodiment.
Figure 2:
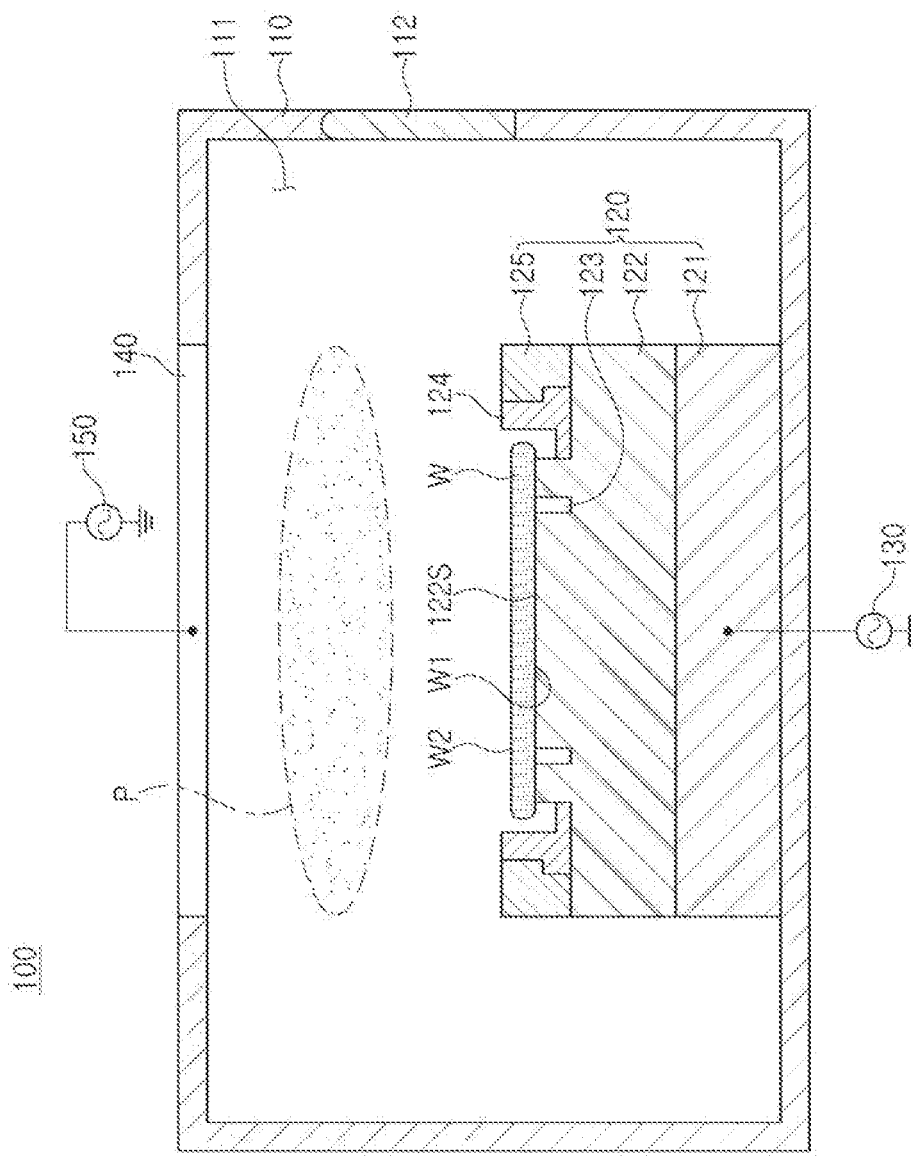
FIG. 2 is a side view of a processing module of the substrate processing apparatus of FIG. 1.
Figure 3:
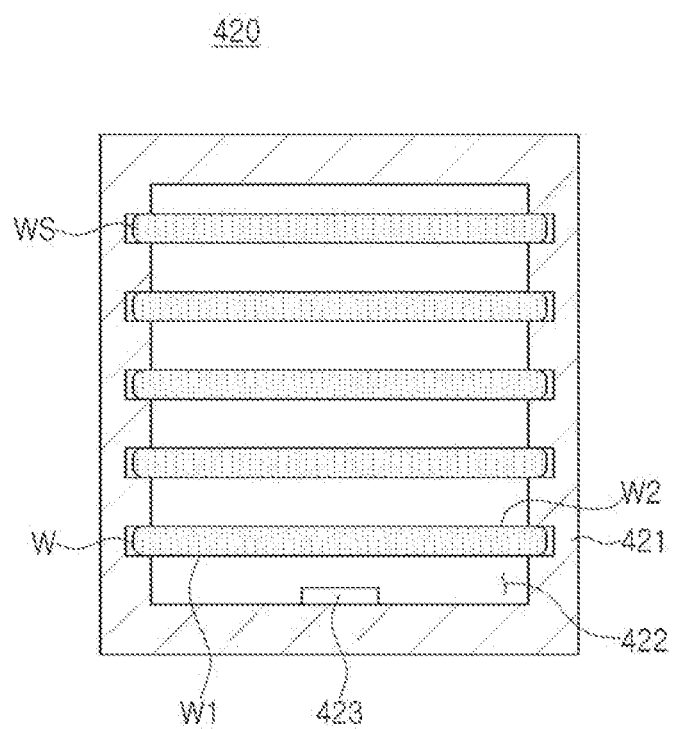
FIG. 3 is a side view of a transfer container of the substrate processing apparatus of FIG. 1.

A substrate processing apparatus according to an embodiment will be described with reference to FIGS. 1 to 3. FIG. 1 is a schematic plan view of a substrate processing apparatus according to an embodiment, FIG. 2 is a side view of a processing module of the substrate processing apparatus of FIG. 1, and FIG. 3 is a side view of a transfer container of the substrate processing apparatus of FIG. 1.

Referring to FIG. 1, a substrate processing apparatus 10 according to an embodiment may be used to perform an etching process for etching a film on a substrate W such as a wafer used in manufacturing a semiconductor device. However, embodiments are not limited thereto, and the substrate processing apparatus may be applied to various processes requiring correction of misalignment of the substrate W.

The substrate processing apparatus 10 may include a processing module 100, a substrate transfer module 200, a load port 400, an interface module 500, a load-lock chamber 600, and a controller 700, for processing the substrate W.

The processing module 100 may perform a process for the substrate W. The process may be predetermined. In some embodiments, the processing module 100 may perform processes such as a chemical vapor deposition process, an etching process, a photo process, a cleaning process, and the like. According to an embodiment, a case in which an etching process may be performed in the processing module 100 will be described as an example. In addition, according to an embodiment, a plurality of processing modules 100 may be disposed around one substrate transfer module 200. However, the number of processing modules 100 may be variously changed according to a processing amount of the substrate W. The processing module 100 according to an embodiment may include a first processing module 100A, a second processing module 100B, a third processing module 100C, and a fourth processing module 100D, but embodiments are not limited thereto and the number of processing modules may be changed.

Referring to FIG. 2, the processing module 100 may include a chamber 110 having a reaction space formed by a sidewall, an upper electrode 140 disposed in an upper portion of the chamber 110, and an electrostatic chuck 120 opposing the upper electrode 140, disposed on a lower portion of the chamber 110, and supporting the substrate W. As discussed above, a processing module 100 according to an embodiment may include first to fourth processing modules 100A, 100B, 100C, and 100D, and each processing module 100A to 100D may have a similar configuration to the configuration illustrated in FIG. 2 and thus a repeated description thereof is omitted for conciseness.

The electrostatic chuck 120 may include a base body 121 functioning as a lower electrode, a plate 122 attached to an upper surface of the base body 121 and including an electrode therein, a focusing ring 124 disposed on the plate 122, and an insulation ring 125 surrounding the focusing ring 124. An upper surface 122S of the plate 122 may serve as a loading region on which the substrate W is seated, and an instrument such as a lifting pin 123 may be disposed on an upper surface 122s of the plate 122. Hereinafter, the loading region, the upper surface 122S of the plate 122, and a upper surface of the electrostatic chuck 120 may be used interchangeably.

The upper electrode 140 may be disposed in the upper portion of the chamber 110 to face the electrostatic chuck 120. The upper electrode 140 may be a showerhead that distributes a process gas into the chamber 110. The showerhead may spray the process gas on a surface of the substrate W.

The electrostatic chuck 120 may receive power from a first power source 130, and the upper electrode 140 may receive power from a second power source 150. The electrostatic chuck 120 and the upper electrode 140 may be synchronized to form an electric field. A process gas supplied to an internal space 111 of the chamber 110 may be excited as a plasma P by the electric field.

Returning to FIG. 1, at least one processing module 100 may be disposed around the substrate transfer module 200, and a transfer robot 220, which serves as a transfer device for loading and unloading the substrate W into and out of the at least one processing module 100, may be disposed therein.

The load-lock chamber 600 may be located between the interface module 500 and the substrate transfer module 200, and may be provided to temporarily accommodate a substrate W to be loaded into the processing module 100 for processing the same, and a substrate W on which a process is completed. The load-lock chamber 600 may alternately maintain an atmospheric pressure state and a vacuum state. A load-lock chamber 600 according to an embodiment may include a first load-lock chamber 600A and a second load-lock chamber 600B, but embodiments are not limited thereto and the number of load-lock chambers 600 may be changed.

The load port 400 may support a transfer container 420 for accommodating a plurality of substrates W, and the interface module 500 may transfer a substrate W accommodated in the transfer container 420 to the processing module 100. The interface module 500 may include an interface robot 510 for transferring a substrate W from the transfer container 420 to a processing module 100 and for transferring a substrate W processed by the processing module 100 back into the transfer container 420. As an example, as illustrated, in some embodiments, the substrate processing apparatus 10 may include a plurality of load ports 400.

The controller 700 may be provided to control an overall operation of the substrate processing apparatus 10, may be implemented as a processor, for example, a central processing unit (CPU), a graphics processing unit (GPU), a microprocessor, an application specific integrated circuit (ASIC), a field programmable gate arrays (FPGA), or the like, and may include a memory that stores various data for an operation of the substrate processing apparatus 10, and a database to be described later in advance may be stored in the memory.

Referring to FIGS. 1 and 3, the transfer container 420 may have an internal space 422 and may load a plurality of substrates W and a sensor module WS in the internal space 422. At least one substrate W, among the plurality of substrates W, may be loaded in a lowermost portion of the transfer container 420. The transfer container 420 may be a sealed transfer container having a door such that external air does not flow into the transfer container 420. For example, the transfer container 420 may be a front opening unified pod (FOUP). The transfer container 420 may be used to transport a substrate W that has been processed in a substrate processing apparatus 10 to another substrate processing apparatus 10.

An image capturing device 423 for acquiring an image of a lower surface W1 of the substrate W may be disposed on a lower surface of the internal space 422. The lower surface W1 of the substrate W may be a back-side of the substrate W. According to an embodiment, the image capturing device 423 may be disposed in a separate measurement location in a process of transporting the transfer container 420, rather than a lower portion of the transfer container 420. For example, the image capturing device 423 may include a charge coupled device (CCD) camera or a complementary metal-oxide semiconductor (CMOS) camera. The image capturing device 423 may acquire an image of the lower surface W1 of the substrate W and transmit data acquired by capturing the image of the lower surface W1 of the substrate W to the controller 700. The controller 700 may control the image capturing device 423 of the transfer container 420 to capture the image of the lower surface W1 of the substrate W included in each of the transfer container 420. However, embodiments are not limited thereto, and according to an embodiment, for example, the controller 700 may control the image capturing device 423 to capture images of the lower surfaces W1 of the substrates W included in some of the transfer containers 420, selectively.

It can be understood that an upper surface W2 of the substrate W loaded on the transfer container 420 is a surface to be processed by the processing module 100, and the lower surface W1 of the substrate W is a surface to be seated on a substrate support such as the electrostatic chuck 120. In a process of processing the substrate, particles may be attached to the lower surface W1 of the substrate W, and the particles may be attached to a position, corresponding to a position in which an instrument on which the substrate W is installed in a loading region is disposed, to form a pattern. In an embodiment, the instrument means that a plurality of instruments may be exposed to a loading region, to be used as a reference point for identifying a center of the loading region. For example, the instrument may be the lifting pin 123, and a pattern formed of particles may be formed on the lower surface W1 of the substrate W, to correspond to a position in which the lifting pin 123 is disposed.

In this manner, since the position in which the instrument of the loading region is disposed may be transferred to the pattern formed by the particles attached to the lower surface W1 of the substrate W, the center of the loading region may be calculated by analyzing the pattern of the particles. In an embodiment, a pattern of particles may be formed on the lower surface W1 of the substrate W, to correspond to a position in which the lifting pin 123 disposed on the upper surface 122S of the plate 122 is disposed.

In general, the transfer robot 220 may load the substrate W such that a center of the processing module 100 matches to a center of the substrate W. As an operating time of the transfer robot 220 increases, a deviation between a center of the upper surface 122S of the plate 122 of the processing module 100 and the center of the substrate W tends to gradually increase. To reduce the deviation, teaching for resetting a position in which the transfer robot 220 loads the substrate W into the processing module 100 may be performed. Since it may be necessary to stop an operation of the substrate processing apparatus 10 to perform the teaching, when the teaching is performed, there may be a problem in that a substrate processing amount per unit time decreases to increase production costs.

Figure 6:
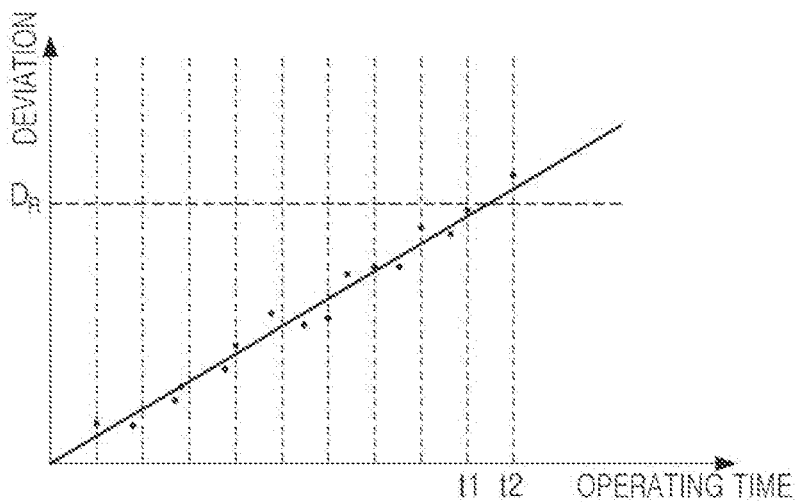
FIG. 6 is a view illustrating a correlation of a substrate processing apparatus between an operating time and a deviation of centers, according to an embodiment.

Referring to FIG. 6, based on a first image IMG1 acquired by capturing an image of a lower surface W1 of a substrate W, a substrate processing apparatus of an embodiment may predict a point in time t2 at which a deviation value between a center of the substrate W and a center of an upper surface 122S of a plate 122 exceeds a reference value DR, and, before the point in time at which the reference value is exceeded arrives (t1), the substrate processing apparatus may load a sensor module WS on the plate 122, and may precisely measure a degree of misalignment of the substrate W. However, embodiments are not limited thereto, and in some embodiments, at a point in time at which a deviation between a calculated center and a reference position is expected to exceed the reference value, teaching for correcting the deviation value may be performed immediately without carrying the sensor module WS and loading the sensor module W2 on the plate 122. When the reference position is calculated based on an image acquired by seating the sensor module WS in the loading region and capturing an image thereof, there may be advantages that a transfer robot 220 may be taught with high precision and the teaching may be performed without stopping the substrate processing apparatus 10. However, since the sensor module WS is carried in instead of the substrate W processed by the processing module 100, a processing amount of the substrate W (i.e., a number of substrates W that may be processed per unit time) to be processed in the processing module 100 is reduced. Therefore, to minimize a decrease in processing amount of the substrate W, the sensor module WS may be carried into the processing module 100 only when teaching is to be performed. For example, in an embodiment, since a point in time at which the sensor module WS is carried thereinto may be determined based on a captured image of the lower surface W1 of the substrate W, a decrease in processing amount of the substrate W may be minimized without stopping the substrate processing apparatus 10.

In addition, an image of the lower surface W1 of the substrate W may be captured before carrying the substrate W out of a transfer container 420 for processing in the processing module 100, and may be captured after processing the substrate W in the processing module 100, respectively. A controller 700 may determine whether the substrate W is seated in a target position, based on an image captured before being processed in the processing module 100 (hereinafter, referred to as 'a first reference image RF_IMG1') and an image captured after processing (hereinafter, referred to as 'a first image IMG1'). This operation will be described with reference to FIGS. 4A and 4B.

Figure 4A:
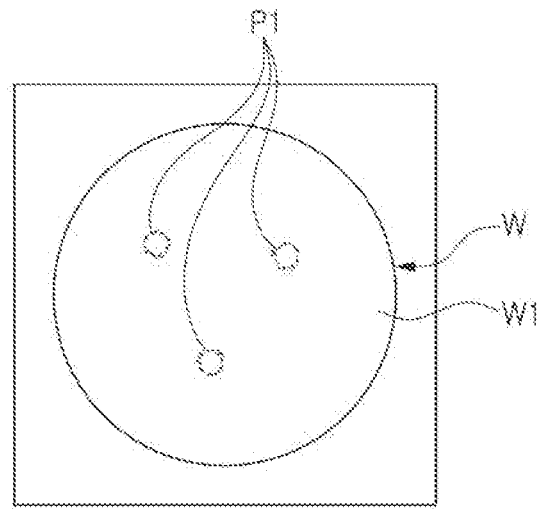
FIG. 4A illustrates an image of a lower surface of a substrate captured before the substrate is carried into a processing module, according to an embodiment.
Figure 4B:
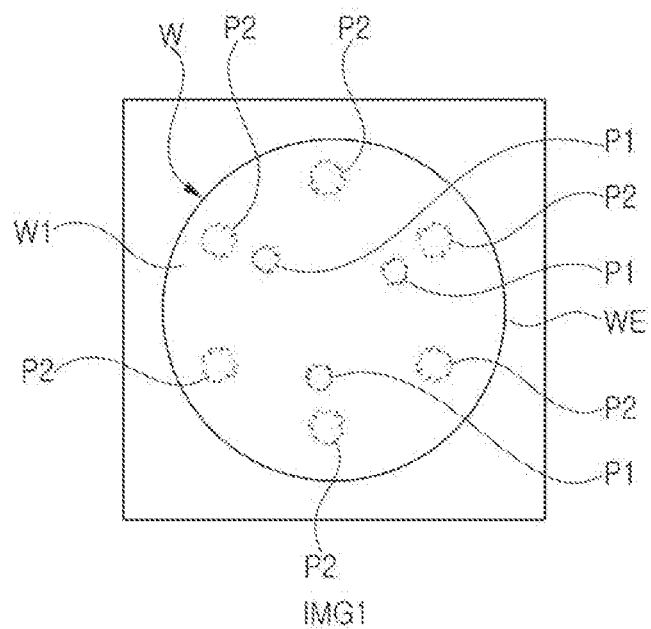
FIG. 4B illustrates an image of a lower surface of a substrate captured after the substrate is carried into a processing module and before a substrate processing process is performed, according to an embodiment.

FIG. 4A may be a first reference image RF_IMG1 acquired by capturing an image of a lower surface W1 of a substrate W before the substrate W is carried into a processing module 100. It can be understood that first patterns P1 formed on the lower surface W1 of the substrate W are attached to equipment in which a substrate processing process is carried out. FIG. 4B may be a first image IMG1 of the lower surface of the substrate that is captured after the substrate W is carried into the processing module 100 and the substrate processing process is performed. It can be understood that second patterns P2 formed on the lower surface W1 of the substrate W are attached during the substrate processing process performed in the processing module 100. A controller 700 may identify the first patterns P1 from the first reference image RF_IMG1, and may identify the first patterns P1 and the second patterns P2 from the first image IMG1. The controller 700 may identify the first patterns P1 as a common pattern, and may remove the first patterns P1 from the first image IMG1, to calculate positions of centers of the second patterns P2 except for the first patterns P1 formed in equipment of a previous stage. Since the second patterns P2 correspond to positions of instruments disposed on an electrostatic chuck 120 disposed in the processing module 100 on which the processing process has been performed, the centers of the second patterns P2 may be calculated to roughly calculate a center of the electrostatic chuck 120.

According to an embodiment, the first reference image RF_IMG1 may not be captured. In this case, position information of the first patterns P1 formed in the equipment of the previous stage may be stored in a database in advance, and the controller 700 may identify the second patterns P2 from the first image IMG1 with reference to the position information stored in the database.

In addition, the controller 700 may identify an edge WE of the substrate W from the first image IMG1, and may calculate a center of the substrate W from the edge WE of the substrate W. The controller 700 may determine whether the substrate W is loaded in a target position of the electrostatic chuck 120 from the calculated centers of the second patterns P2 and the calculated center of the substrate W. A process in which the controller 700 determines whether the substrate W is loaded in a target position of the electrostatic chuck 120 will be described with reference to FIG. 5.

Figure 5:
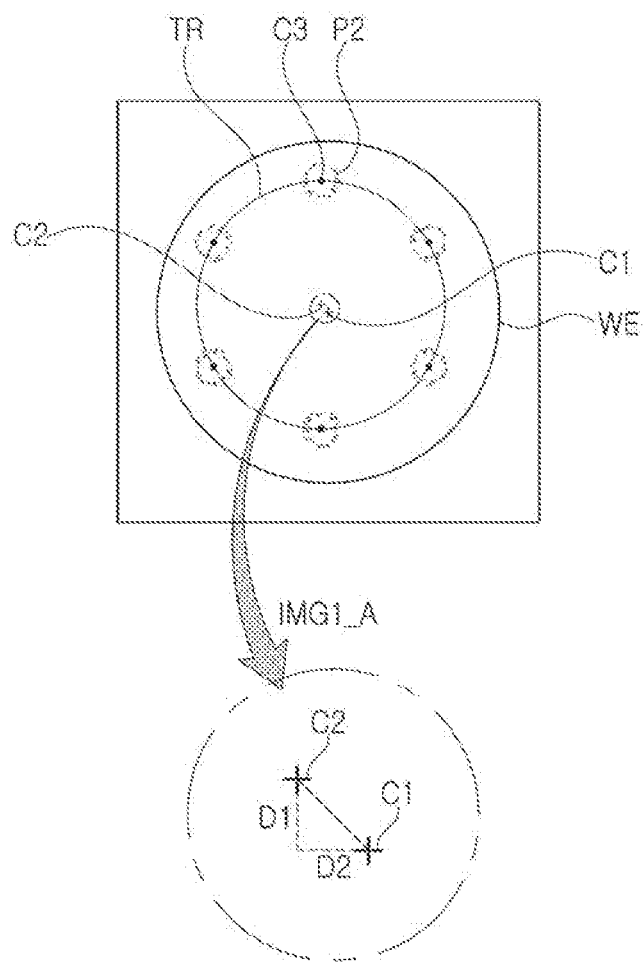
FIG. 5 is a view illustrating a process of identifying a center of a substrate, based on the image of the lower surface in FIG. 4B, according to an embodiment.

FIG. 5 is a view illustrating a corrected image IMG1_A on which image processing for deleting the first patterns P1 from the first image IMG1 of FIG. 4B is performed. A controller 700 may identify centers C3 of second patterns P2 formed on a lower surface of a substrate W, and may calculate a trace TR connecting the centers C3. The controller 700 may calculate a center C2 of the trace TR. The center C2 of the trace TR may schematically represent a center of an electrostatic chuck 120, and may be used as a reference value for calculating a deviation value from a center C1 of a substrate W. For example, the controller 700 may compare the center C2 of the trace TR with the center C1 of the substrate W, and may calculate deviation values D1 and D2. The calculated deviation values D1 and D2 may be used as data for determining whether to carry a sensor module WS into a processing module 100. For example, when the deviation values D1 and D2 are within an allowable error range (e.g., less than or equal to a threshold value), the controller 700 may determine not to carry the sensor module WS into the processing module 100. When the deviation values D1 and D2 exceed the allowable error range (e.g., greater than the threshold value), the controller 700 may determine to carry the sensor module WS into the processing module 100 to calculate a more accurate deviation value.

Figure 7:
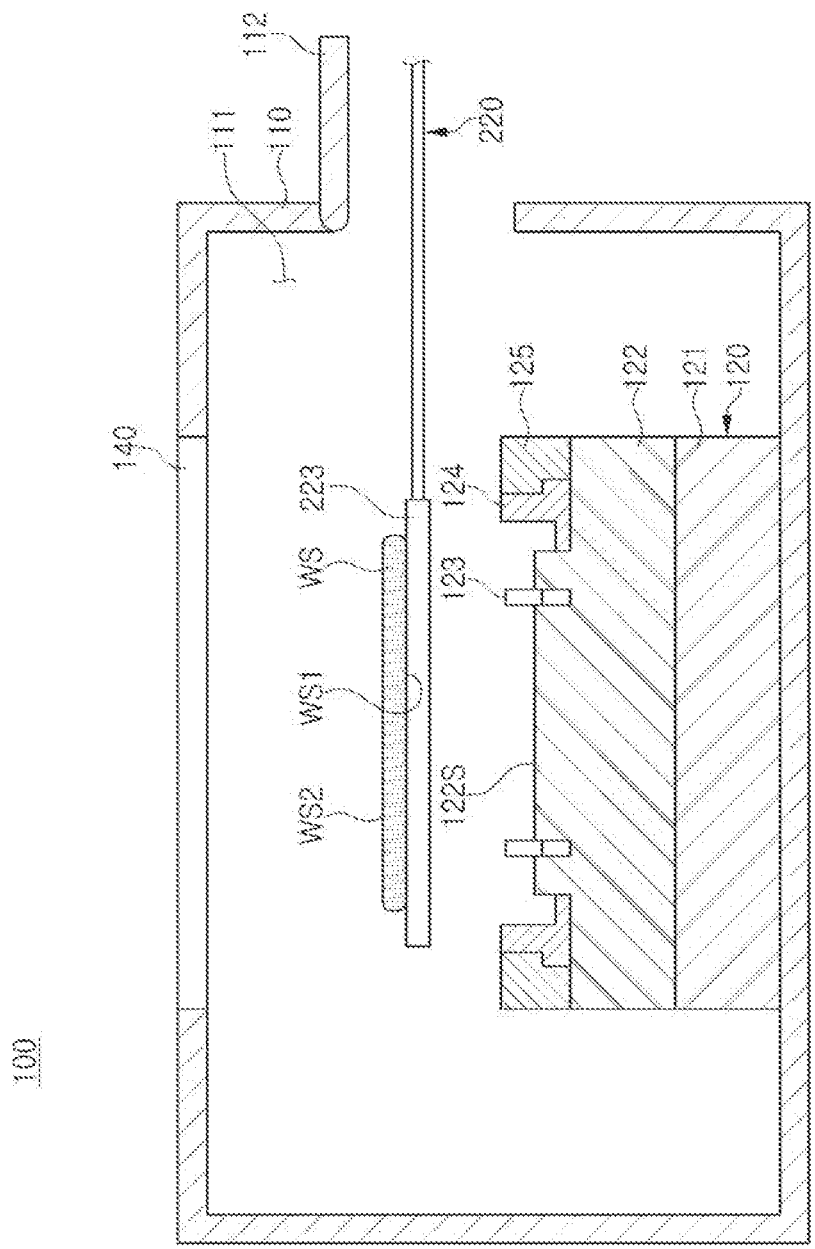
FIG. 7 is a view illustrating a process of carrying a sensor module into the processing module of FIG. 2, according to an embodiment.

The sensor module WS will be described with reference to FIGS. 7 to 9. FIG. 7 is a view illustrating a process of carrying a sensor module into the processing module of FIG. 2, FIG. 8 is a view illustrating a state in which a sensor module is seated on the electrostatic chuck of FIG. 7, and FIG. 9 is a top plan view of the electrostatic chuck of FIG. 8.

Referring to FIG. 7, a sensor module WS may be loaded on a hand 223 of the transfer robot 220, and may be carried into the internal space 111 through a door 112 of the chamber 110. The sensor module WS carried into the internal space 111 may be supported by the lifting pin 123 protruding on the upper surface 122S of the plate 122, and then may be lowered, to be seated on the upper surface 122S of the plate 122 providing a loading region. The sensor module WS may be a measuring device for precisely measuring a deviation value between the center of the substrate W and the center of the electrostatic chuck 120. The sensor module WS may have a wafer shape, similar to the substrate W, but embodiments are not limited thereto. For example, in some embodiments, the sensor module WS may have various shapes, such as a cross shape or the like, in addition to the wafer shape.

Figure 8:
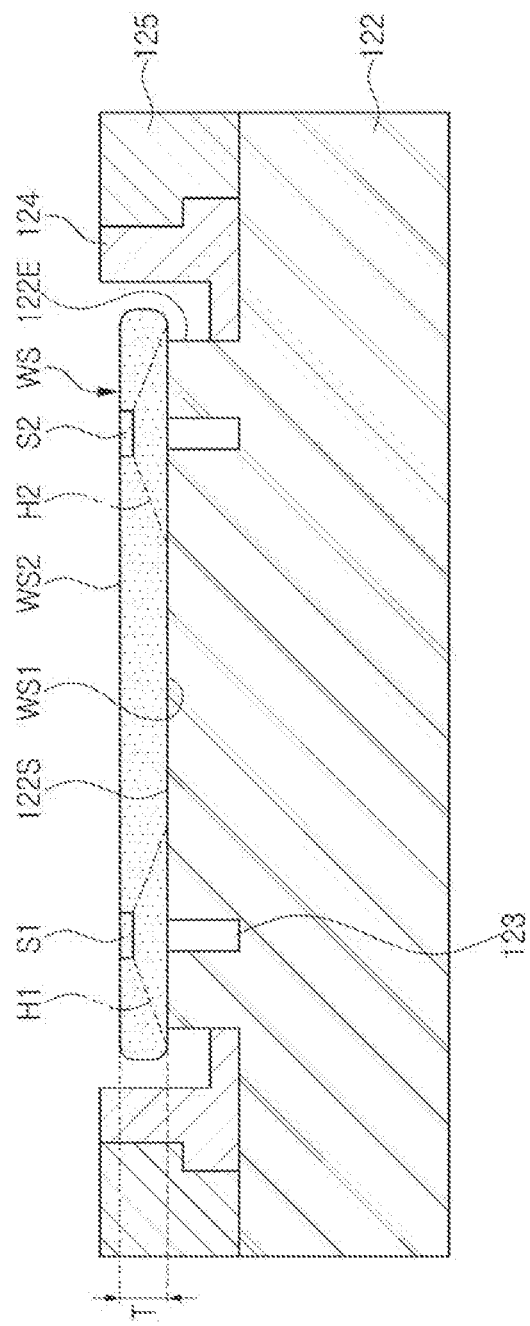
FIG. 8 is a view illustrating a state in which a sensor module is seated on the electrostatic chuck of FIG. 7, according to an embodiment.
Figure 9:
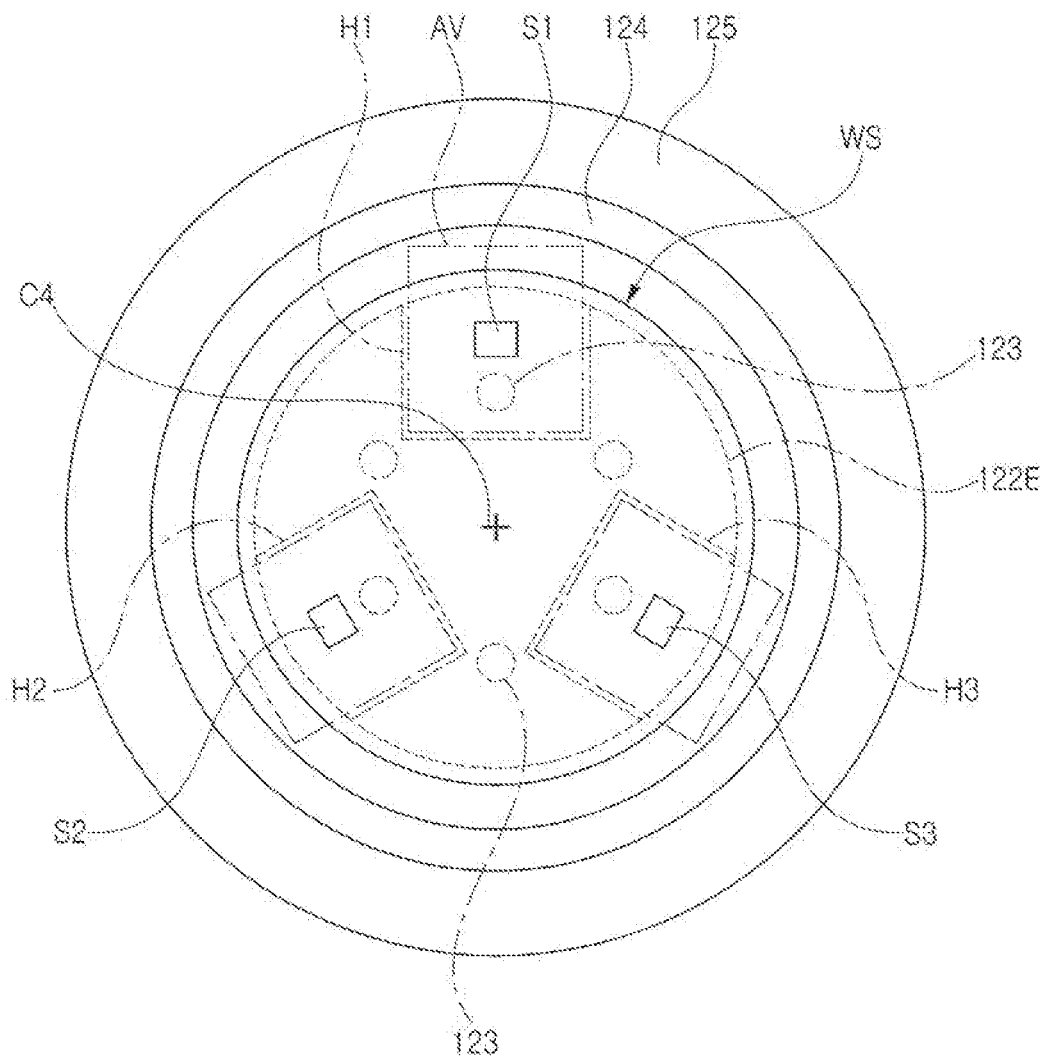
FIG. 9 is a top plan view of the electrostatic chuck of FIG. 8, according to an embodiment.

Referring to FIGS. 8 and 9, the sensor module WS may have a lower surface WS1 to be seated on the upper surface 122S of the plate 122, and an upper surface WS2 opposite to the lower surface WS1. A thickness T of the sensor module WS may be equal to or smaller than a thickness of the substrate W. For example, the thickness T of the sensor module WS may be about 5 mm or less. Image scanning modules S1, S2, and S3 (best seen in FIG. 9) may be disposed in at least three places on the upper surface WS2 of the sensor module WS. The image scanning modules S1, S2, and S3 may be provided for acquiring an image of a portion of an edge 122E of the upper surface 122S of the plate 122 observed through respective holes H1, H2, and H3 passing through the sensor module WS. The image scanning modules S1, S2, and S3 may be disposed in a position in which a portion of the edge 122E of the plate 122 enters an angle of view. The image scanning modules S1, S2, and S3 may include a charge coupled device (CCD) camera or a complementary metal-oxide semiconductor (CMOS) camera.

The sensor module WS may acquire an image including portions of the edge 122E of the upper surface 122S of the plate 122, and may transmit the image to the controller 700. The controller 700 may calculate a center C3 of the upper surface 122S of the plate 122, based on the image captured by the sensor module WS. A process of calculating the center C3 of the upper surface 122S of the plate 122 will be described with reference to FIGS. 10A and 10B.

Figure 10A:
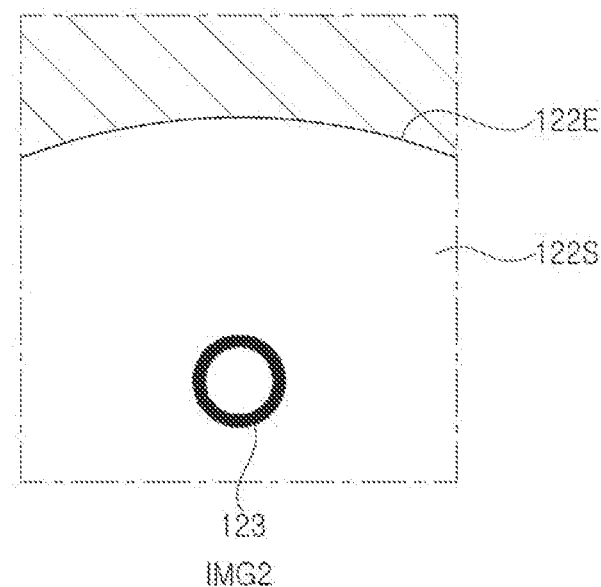
FIG. 10A illustrates an image of an upper surface of the electrostatic chuck captured by the sensor module of FIG. 8, according to an embodiment.
Figure 10B:
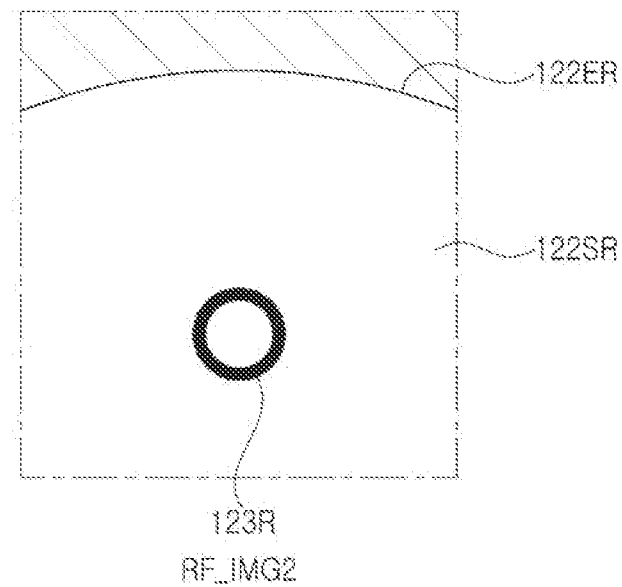
FIG. 10B illustrates a reference image of the electrostatic chuck, according to an embodiment.

FIG. 10A illustrates an image of an upper surface of the electrostatic chuck captured by the sensor module of FIG. 8, according to an embodiment, and FIG. 10B illustrates a reference image of the electrostatic chuck, according to an embodiment. Referring to FIG. 10A, the controller 700 may extract a position value of the lifting pin 123, an instrument disposed on the upper surface 122S of the plate 122, and the portion of the edge 122E, from an image (hereinafter, referred to as 'a second image IMG2') acquired from the sensor module WS. For example, the second image IMG2 may be captured by image scanning module S2 through hole H2. The controller 700 may calculate a center of the upper surface 122S of the plate 122 from the position value for the lifting pin 123 and the portion of the edge 122E. Also, referring to FIG. 10B, the controller 700 may extract an upper surface 122SR and a portion of an edge 122ER of the electrostatic chuck 120, form an image (hereinafter referred to as 'a second reference image RF_IMG2') stored in advance in a memory, and may calculate a reference center of the upper surface 122SR of the plate 122. The controller 700 may compare a center of the electrostatic chuck 120 calculated from the second image IMG2 with a center of the electrostatic chuck 120 calculated from the second reference image, to calculate a deviation value between the center of the substrate W and the center of the electrostatic chuck 120. As described above, the controller 700 may teach the transfer robot 220, based on the calculated deviation value, to correct a position of the substrate W. In some embodiments, the controller 700 may control the transfer robot 220 according to the corrected position of the substrate W. The controller 700 may convert a deviation value in a calculated center C4 of the substrate W, and may store the deviation value in a database in the memory.

Figure 11:
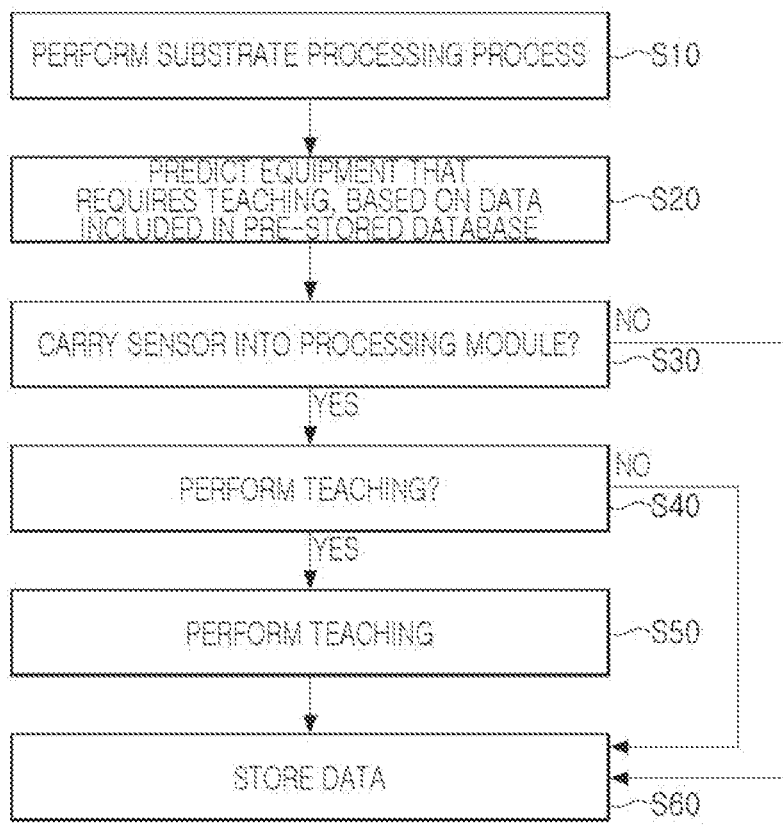
FIG. 11 is a flowchart of a substrate alignment method according to an embodiment.
Figure 12:
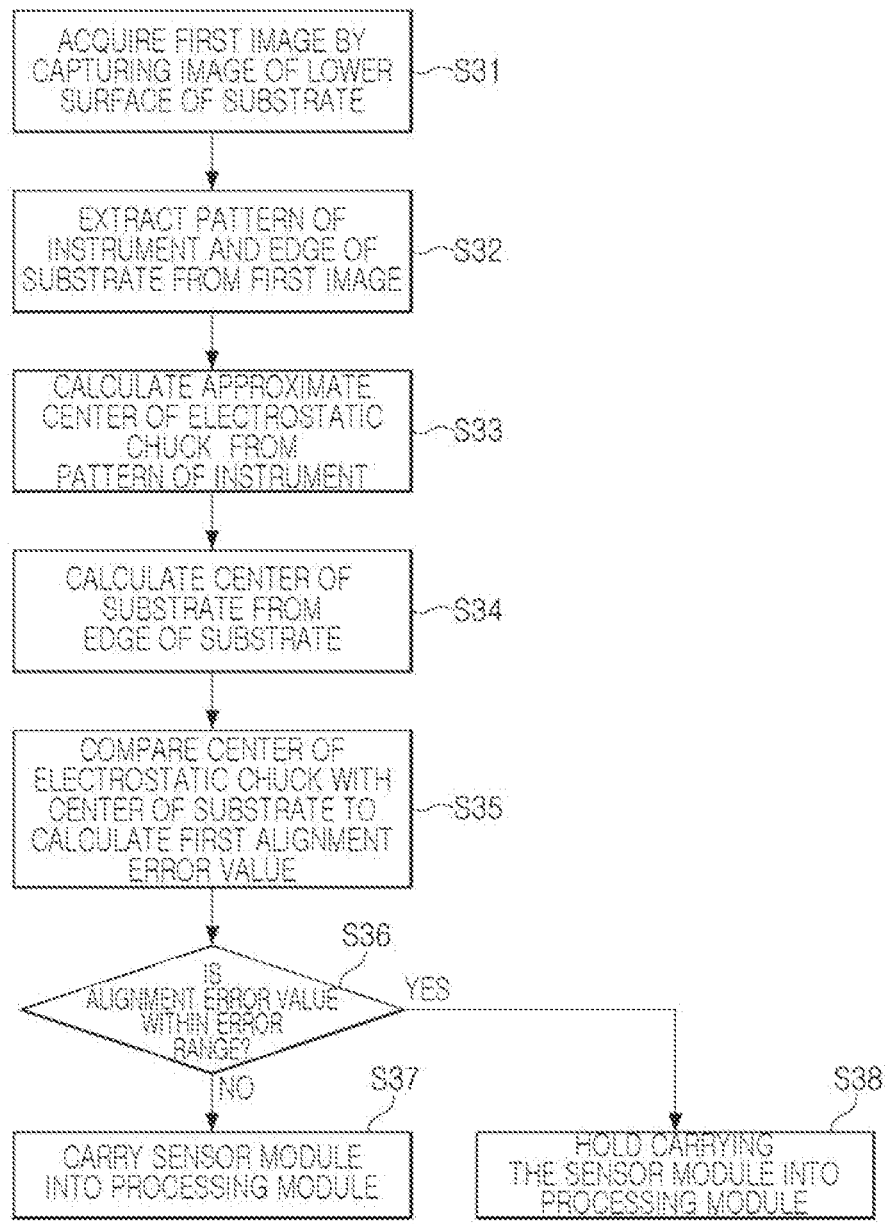
FIG. 12 is a flowchart specifically illustrating operation S30 in the flowchart of FIG. 11, according to an embodiment.
Figure 13:
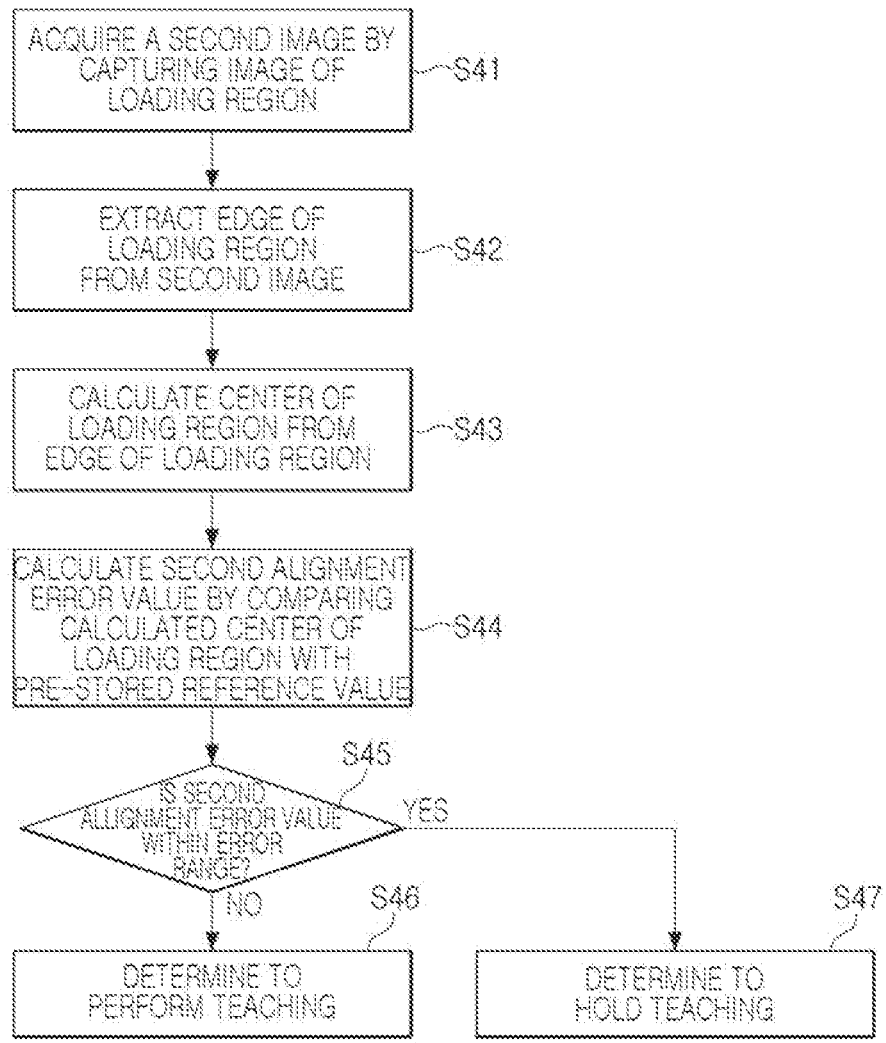
FIG. 13 is a flowchart specifically illustrating operation S40 in the flowchart of FIG. 11, according to an embodiment.

Next, a substrate alignment method according to an embodiment will be described with reference to FIGS. 11 to 13. FIG. 11 is a flowchart of a substrate alignment method according to an embodiment, FIG. 12 is a flowchart specifically illustrating operation S30 of FIG. 11, and FIG. 13 is a flowchart specifically illustrating operation S40 of FIG. 11. A substrate alignment method according to an embodiment may be performed in a substrate processing apparatus in which the substrate processing apparatus illustrated in FIGS. 1 to 3 is employed. Previously, since each configuration of the substrate processing apparatus has been described in detail, detailed description of each configuration of the substrate processing apparatus will be omitted in order to prevent overlapping descriptions and for conciseness.

First, a controller 700 may perform a substrate processing process (S10). For example, the controller 700 may perform the substrate processing process by carrying the substrate W into a chamber of a process module 100 and disposing the substrate W in a loading region of the chamber to load the substrate W into the loading region in the processing module 100. According to an embodiment, the loading region may be an upper surface of an electrostatic chuck 120. According to an embodiment, before loading the substrate W into the processing module 100, the controller 700 may acquire a first reference image RF_IMG1 by capturing an image of a lower surface W1 of the substrate W. The controller 700 may predict equipment that requires teaching, based on data included in pre-stored database (S20). For example, the controller may predict equipment that requires teaching due to a position deviation in a center of the substrate W, based on the data included in the pre-stored database.

For example, when there are a plurality of substrate processing apparatuses 10, the controller 700 may predict a substrate processing apparatus 10 that requires teaching due to occurrence of a deviation, or may predict a processing module 100 that requires teaching, among the substrate processing apparatuses 10. Such prediction may be performed by applying machine learning to the data stored in the database. In some embodiments, predicting equipment in which abnormality occurs may be omitted.

Next, the controller 700 may determine whether to carry a sensor module WS into a processing module (S30). When the controller 700 determines to carry the sensor module WS into the processing module (S30, YES), the controller 700 determines whether to perform teaching (S40). When the controller 700 determines not to carry the sensor module WS into the processing module (S30, NO), the controller 700 stores data S60. Operation S30 is described in more detail with respect to FIG. 12 below.

In operation S40, the controller 700 then determines whether to perform teaching (S40). When the controller determines to perform teaching (S40, YES), the controller performs teaching (S50) and stores data (S60). When the controller determines not to perform teaching (S40, NO), the controller stores data (S60). Operation S40 is described in more detail with respect to FIG. 13 below.

FIG. 12 describes operation S30 in more detail. Specifically, as illustrated in FIG. 12, the controller 700 may acquire a first image IMG1 by capturing an image of the lower surface W1 of the substrate W using an image capturing device 423 (S31), and may extract a pattern of an instrument and an edge of the substrate W from the first image IMG1 (S32). The controller 700 may calculate an approximate center of an electrostatic chuck from a pattern of an instrument (S33). For example, the controller 700 may calculate an approximate position value for a center C2 of the loading region (e.g., the electrostatic chuck) from the pattern of the instrument. The controller 700 may calculate a center of the substrate W from the edge of the substrate W (S34). According to an embodiment, operations S33 and S34 may be performed in a different order. According to an embodiments, operation S33 and S34 may be performed substantially simultaneously. According to an embodiment, the controller 700 may compare the first reference image RF_IMG1 and the first image IMG1, previously acquired, and may delete the pattern formed in a previous substrate processing process from the first image IMG1.

The controller 700 may compare the center of the electrostatic chuck with the center of the substrate to calculate a first alignment error value (S35). For example, the controller 700 may compare the approximate position value for the center C2 of the loading region with the center of the substrate W, to calculate a first alignment error value of a deviation between the approximate center C2 of the loading region and the center of the substrate W. Next, the controller 700 may determine whether the first alignment error value is within an error range (S36). When the first alignment error value is not within the error range (S36, No), the controller may carry the sensor module into the processing chamber (S37). For example, when the first alignment error value exceeds the error range (e.g., is greater than a threshold), the controller 700 may determine to carry the sensor module WS into the processing module 100, and the process proceeds to S40 in FIG. 11.

When the first alignment error value is within the error range (S36, Yes), the controller 700 may hold carrying the sensor module into the processing module (S38). For example, when the first alignment error value is within the error range (e.g., is less than or equal to the threshold), the controller 700 may determine to hold carrying (i.e., to not carry) the sensor module WS into the processing module 100, and the process proceeds to S40 in FIG. 11.

FIG. 13 describes operation S40 in more detail. Operation S40 of determining whether to perform teaching will be described with reference to FIG. 13.

First, the controller 700 may acquire a second image IMG2 by capturing an image of a loading region (S41). For example, the controller may acquire the second image IMG2 by capturing an image of an upper surface of the electrostatic chuck 120 serving as a loading region. The controller 700 may extract the edge 122E of the loading region from the second image (S42). For example, the controller 700 may extract the edge 122E of the upper surface 122S of the plate 122 from the second image IMG2. The controller 700 may calculate a center of the loading region from the edge of the loading region (S43). For example, the controller 700 may calculate a position value for a center of the upper surface 122S of the plate 122 from the extracted edge 122E. The controller 700 may calculate a second alignment error value by comparing the calculated position value of the center with a pre-stored reference value (S44). The controller 700 determines whether the second alignment error is within an error range (S45). When the second alignment error value is not within an error range (S45, No), the controller 700 may determine to perform teaching (S46). For example, when the second alignment error value is greater than a threshold value, the controller 700 may determine to perform teaching. The operation may then proceed with S50 in FIG. 11. When the second alignment error value is within the error range (S45, Yes), the controller 700 may determine to hold the teaching (S47). For example, when the second alignment error value is less than or equal to the threshold value, the controller may determine to hold the teaching. The process then proceeds with S60 in FIG. 11.

Figure 14:
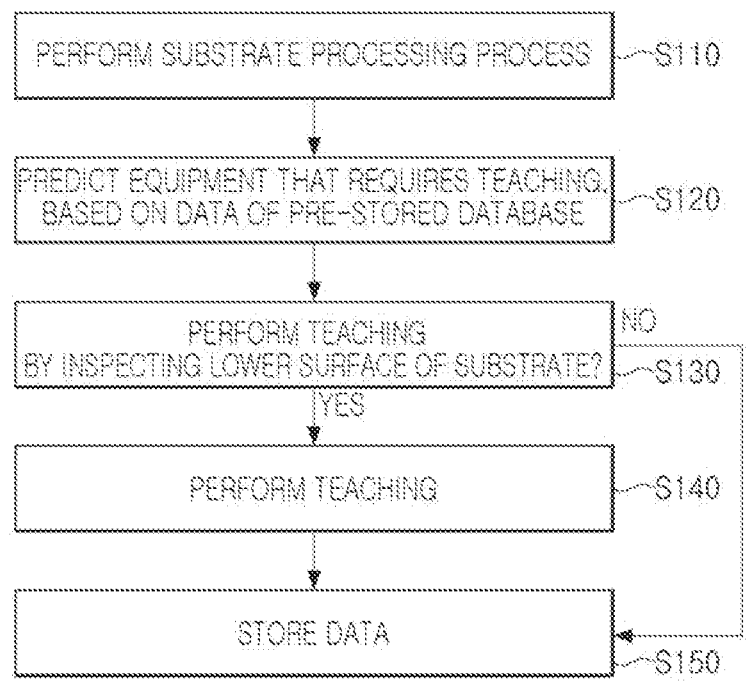
FIG. 14 is a flowchart of a substrate alignment method according to an embodiment.
Figure 15:
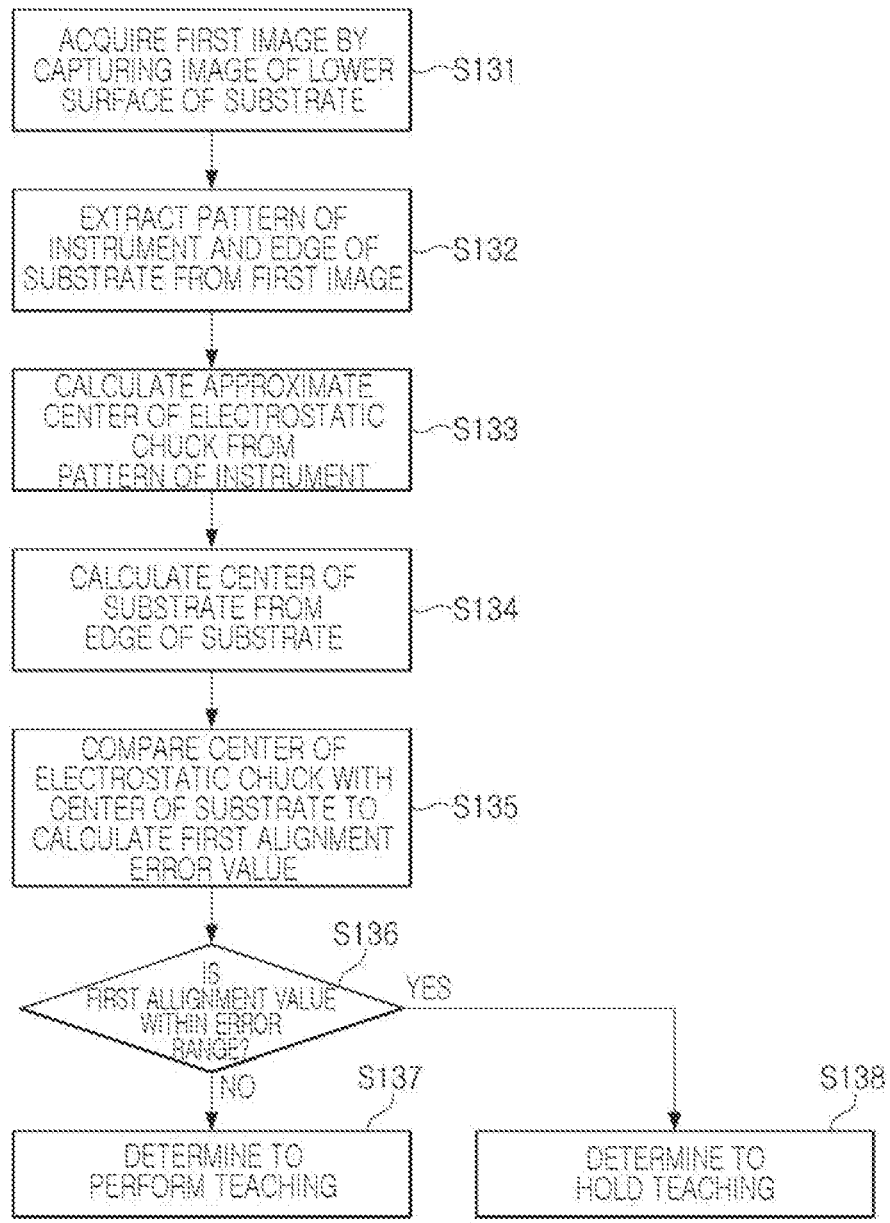
FIG. 15 is a flowchart specifically illustrating an operation S130 in the flowchart of FIG. 14, according to an embodiment.

Next, a substrate alignment method according to an embodiment will be described with reference to FIGS. 14 and 15. FIG. 14 is a flowchart of a substrate alignment method according to an embodiment, and FIG. 15 is a flowchart specifically illustrating S130 of FIG. 14. An embodiment may be different from the embodiments described above, in that determining whether to teach by carrying a sensor module WS into the processing module is eliminated, and determining whether to teach based on a captured image of a lower surface of a substrate W is included. A description of an operation overlapping the above-described embodiments will be omitted for conciseness.

First, a controller 700 may perform a substrate processing process (S110). For example, the controller 700 may perform the substrate processing process by loading a substrate W into a loading region in a processing module 100.

Next, the controller 700 may predict equipment that requires teaching based on data that is pre-stored in a database (S120). For example, the controller 700 may predict equipment that requires teaching due to a position deviation in a center of the substrate W, based on the data that is pre-stored in the database.

Next, the controller 700 may determine whether to teach by inspecting a lower surface of the substrate W (S130). When it is determined to perform teaching by inspecting the lower surface of the substrate (S130, YES), the process proceeds to operation S140. When it is determined not to perform teaching by inspecting the lower surface of the substrate (S130, NO), data is stored (S150).

FIG. 15 describes operation S130 in more detail.

Specifically, the controller 700 may acquire a first image IMG1 by capturing an image of the lower surface of the substrate W using an image capturing device 423 (S131), and may extract a pattern of an instrument and an edge of the substrate W from the first image IMG1 (S132). The controller 700 may calculate an approximate center of an electrostatic chuck from the pattern of the instrument (S133). For example, the controller may calculate an approximate position value for a center C2 of the loading region from the pattern of the instrument. The controller 700 may calculate a center of the substrate W from the edge of the substrate W (S134). The controller 700 may compare the center of the electrostatic chuck with the center of the substrate to calculate a first alignment error value (S135). For example, the controller 700 may compare the approximate position value for the center C2 of the loading region with the center of the substrate W, to calculate a first alignment error value of a deviation between the approximate center C2 of the loading region and the center of the substrate W. Next, the controller 700 may determine whether the first alignment error value is within an error range (S136). When the first alignment error value is not within the error range (S136, NO), the controller 700 may determine to perform teaching (S137). For example, when the first alignment error value is greater than the error range (e.g., greater than a threshold value), the controller 700 may determine to perform teaching. When the first alignment error value is within the error range (S136, YES)), the controller 700 may determine to hold the teaching (S138). For example, when the first alignment error value is less than or equal to the error range (e.g., the threshold value), the controller 700 may determine to hold (i.e. not perform) the teaching.

When it is determined to perform the teaching in S130, the controller 700 may perform the teaching (S140) and subsequent steps of storing the data (S150). When it is determined to hold the teaching in S130, the controller 700 may subsequently only convert the data and store the data in a database (S160).

A substrate processing apparatus and a substrate alignment method according to various embodiments may predict a point in time for teaching a transfer robot, and, based on this, may teach the transfer robot in real time, to teach the transfer robot without stopping usage of equipment.

Various advantages and effects of various embodiments are not limited to the above, and will be more easily understood in the process of describing specific embodiments.

While example embodiments have been illustrated and described above, it will be apparent to those skilled in the art that modifications and variations could be made without departing from the scope of the present disclosure as defined by the appended claims.

What is claimed is:

1. A method comprising:
performing a substrate processing process by carrying a substrate into a chamber and disposing the substrate in a loading region of the chamber;
determining whether to carry a sensor module into the chamber based on a first alignment error value, the first alignment error value being calculated by capturing an image of a lower surface of the substrate to acquire a first image, identifying an edge of the substrate and particle patterns attached to and formed on the lower surface of the substrate during the substrate processing process, from the first image, and calculating the first alignment error value of a deviation between an approximate position value for a center of the loading region calculated from the particle patterns and a center of the substrate calculated from the edge of the substrate; and
determining whether to teach a transfer robot that deposits the substrate in the chamber based on a second alignment error value, the second alignment error value being calculated by disposing the sensor module in the loading region, capturing an image of the loading region to acquire a second image, extracting an edge of the loading region from the second image, calculating a precise position value for the center of the loading region from the edge of the loading region, and calculating the second alignment error value of a deviation between the precise position value and a pre-stored reference position value.

2. The method of claim 1, wherein, when the first alignment error value is within a pre-stored error range, it is determined to carry the sensor module.

3. The method of claim 1, further comprising, before the performing the substrate processing process, acquiring a first reference image by capturing an image of the lower surface of the substrate.

4. The method of claim 3, wherein the approximate position value is calculated by:
identifying a common pattern that is commonly disposed in the first reference image and the first image, among the particle patterns; and
removing the common pattern from the particle patterns and calculating the approximate position value for the center of the loading region based on the first reference image and the first image from which the common pattern is removed.

5. The method of claim 1, wherein the approximate position value is calculated by:
calculating a trace that connects centers of the particle patterns; and
calculating a center of the trace as the approximate position value for the center of the loading region.

6. The method of claim 1, wherein the loading region is an upper surface of an electrostatic chuck disposed in the chamber.

7. The method of claim 1, further comprising, after the determining to teach the transfer robot, storing the second alignment error value in a database.

8. The method of claim 7, wherein the chamber comprises a plurality of chambers, and
wherein the method further comprises, before the determining whether to carry the sensor module, predicting a chamber that requires teaching of the transfer robot, among the plurality of chambers, by applying machine learning to information stored in the database.

9. A method comprising:
performing a substrate processing process by carrying a substrate into a chamber and disposing the substrate in a loading region of the chamber;
capturing an image of a lower surface of the substrate to acquire a first image;
identifying particle patterns formed on the lower surface of the substrate during the substrate processing process, and an edge of the substrate, from the first image;
calculating a first alignment error value of a deviation between a first approximate position value for a center of the loading region calculated from the particle patterns and a second approximate position value for a center of the substrate calculated from the edge of the substrate; and
determining a point in time for teaching a transfer robot that disposes the substrate into the chamber, based on the first alignment error value.

10. The method of claim 9, further comprising, before the point in time for teaching a transfer robot, disposing, in the loading region, a sensor module, capturing an image of the loading region using the sensor module to acquire a second image, extracting an edge of the loading region from the second image, calculating a precise position value for the center of the loading region from the edge of the loading region, and calculating a second alignment error value of a deviation between the precise position value and a pre-stored reference position value; and
teaching the transfer robot based on the second alignment error value.

11. The method of claim 10, wherein the substrate is a wafer, and
the sensor module has a shape that is substantially identical to a shape of the substrate.

12. The method of claim 11, wherein a thickness of the sensor module is about 5 mm or less.

13. The method of claim 9, further comprising, before the carrying the substrate into the chamber, acquiring a first reference image by capturing an image of the lower surface of the substrate.

14. The method of claim 9, further comprising, after the determining the point in time for teaching the transfer robot, storing the first alignment error value in a database.

15. The method of claim 14, wherein the chamber comprises a plurality of chambers, and
wherein the method further comprises, before the calculating the first alignment error value, predicting a chamber that requires teaching of the transfer robot, among the plurality of chambers, by applying machine learning to information stored in the database.

16. A method comprising:
performing a substrate processing process by disposing a substrate in a loading region in a chamber;
acquiring a first image by capturing an image of a lower surface of the substrate;
identifying particle patterns formed on the lower surface, and an edge of the substrate, from the first image;

calculating an approximate position value for a center of the loading region from the particle patterns and calculating a center of the substrate from the edge of the substrate;

calculating a first alignment error value of a deviation between the approximate position value for the center of the loading region and the center of the substrate;

determining whether to carry a sensor module into the chamber, based on the first alignment error value;

when it is determined to carry the sensor module into the chamber, carrying the sensor module into the chamber, disposing the sensor module in the loading region, and capturing a second image of the loading region;

extracting an edge of the loading region from the second image;

calculating a precise position value for the center of the loading region from the edge of the loading region;

calculating a second alignment error value of a deviation between the precise position value and a pre-stored reference position value; and determining a point in time for teaching a transfer robot that deposits the substrate in the chamber, based on the second alignment error value.

17. The method of claim 16, wherein, when the first alignment error value is within a pre-stored error range, it is determined to carry the sensor module.

18. The method of claim 16, wherein when the first alignment error value is not within of a pre-stored error range, it is determined to hold carrying of the sensor module.

19. The method of claim 16, wherein the calculating the approximate position value, further comprises:

calculating a trace that connects centers of the particle patterns; and calculating a center of the trace as the approximate position value for the center of the loading region.

20. The method of claim 19, wherein the loading region is disposed on an upper surface of an electrostatic chuck disposed in the chamber, wherein the second image is acquired by capturing an image of the upper surface of the electrostatic chuck.

* * * * *